(12) United States Patent
Weber et al.

(10) Patent No.: US 8,717,040 B2
(45) Date of Patent: May 6, 2014

(54) METHOD FOR INSTANTANEOUSLY DETERMINING RATES OF DISTORTION OF SIGNALS ON AN AC ELECTRICAL NETWORK, AND ASSOCIATED DEVICE

(75) Inventors: Marc Weber, Toulouse (FR); Aymeric Plo, Plaisance du Touch (FR); Denis Blache, Toulouse (FR)

(73) Assignee: Airbus Operations SAS, Toulouse (FR)

( * ) Notice: Subject to any disclaimer, the term of this patent is extended or adjusted under 35 U.S.C. 154(b) by 711 days.

(21) Appl. No.: 12/304,503

(22) PCT Filed: Jun. 12, 2007

(86) PCT No.: PCT/FR2007/051427
§ 371 (c)(1),
(2), (4) Date: Nov. 11, 2009

(87) PCT Pub. No.: WO2008/000990
PCT Pub. Date: Jan. 3, 2008

(65) Prior Publication Data
US 2010/0052699 A1    Mar. 4, 2010

(30) Foreign Application Priority Data
Jun. 29, 2006   (FR) ..................... 06 52708

(51) Int. Cl.
*G01R 23/20*   (2006.01)
(52) U.S. Cl.
USPC .......................................... 324/623; 324/620
(58) Field of Classification Search
USPC ........................................................ 324/623
See application file for complete search history.

(56) References Cited

U.S. PATENT DOCUMENTS

| | | | |
|---|---|---|---|
| 3,042,864 A * | 7/1962 | Godbey | ...................... 324/76.27 |
| 5,487,016 A | 1/1996 | Elms | |
| 5,508,623 A | 4/1996 | Heydt et al. | |
| 5,751,138 A * | 5/1998 | Venkata et al. | ................ 323/207 |
| 2006/0271312 A1* | 11/2006 | Hayes et al. | ..................... 702/60 |

OTHER PUBLICATIONS

Eid, et al., On power quality of variable-speed constant-frequency aircraft electric power systems, IEEE Trans on Power Delivery, V. 25, No. 1, Jan. 2010, p. 55-65.*
Green, D.C., Digital Electronics, Addison Wesley Longman Ltd., 1986, p. 328-342.*
Akagi, Hirofumi, The state-of-art of active filters for power condtioning, EPE 2005, Dresden, ISBN 90-75815-08-5, p. 1-15.*
IEEE STd. 1531, Guide for Application and Specification of Harmonic Filters, 2003. p. 1-60.*
GE Industrial, Michael Leporace, Harmonic Design Considerations, p. 1-8.*
Square D, Power System Harmonics, Product Data Bulletin 8803PD9402, 1994, p. 1-8.*
French Search Report dated Mar. 8, 2007.

* cited by examiner

*Primary Examiner* — Thomas F Valone
(74) *Attorney, Agent, or Firm* — Nixon & Vanderhye P.C.

(57) ABSTRACT

A method for instantaneously determining rates of distortion on variable frequency signals, and an associated device, in which a harmonic distortion rate is calculated across the shortest possible temporal window, corresponding to the duration of a period of a given signal's fundamental. Hence, the aim being to precisely determine the signal frequency value, whose HDR is to be calculated, an iteration of certain measurements, achieved at the time of a given calculation, is embodied in order to calculate the HDR on subsequent signals.

16 Claims, 2 Drawing Sheets

METHOD FOR INSTANTANEOUSLY DETERMINING RATES OF DISTORTION OF SIGNALS ON AN AC ELECTRICAL NETWORK, AND ASSOCIATED DEVICE

CROSS-REFERENCE TO RELATED APPLICATIONS

This application is the US National Stage of International Application No. PCT/FR2007/051427 International Filing Date 12 Jun. 2007, which designated the United States of America and which International Application was published under PCT Article 21 (2) as WO Publication No. WO 2008/000990 A2 and which claims priority to French Application No. 06 52708, filed on 29 Jun. 2006, the disclosures of which are incorporated herein by reference in their entireties.

BACKGROUND

1. Field

The disclosed embodiments concern a method for instantaneously determining a signal's distortion rate on an alternating-current main supply, notably on an alternating-current main supply supplying variable frequency signals. It also concerns an electronic device capable of implementing such a method.

The essential purpose of the disclosed embodiments is to propose a solution for supplying, in real time, data for characterising interferences present on an electric network, notably an electric network whose voltage frequency available on the network is variable. The method according to the aspects of the disclosed embodiments is nevertheless directly adaptable to electric networks whose available voltage frequency is stationary.

The aspects of the disclosed embodiments generally involve the analysis of alternating-current main supplies, notably the determination of interferences possibly present on such networks. Such an analysis may notably consist of an operation aiming to qualify the linearity of a system's characteristic when linked to the electric network being considered. If such characteristic is linear, the system responds to a sinusoid by a sinusoid; otherwise, it introduces a distortion and the output signal is no longer sinusoidal, but has acquired harmonics.

The distortion rate, also called "harmonic distortion rate", having the abbreviation of HDR, has a size that enables to evaluate, using a single number, the interference of a current or of a voltage at a given point of the electric network, by considering the deformation of the sinusoidal size of the signals of the said network. This rate is frequently used to measure the harmonic pollution provoked by the various apparatus linked to the network being considered, and to verify the rapid fluctuations on the network. The HDR is defined as being the relationship between the overall efficient value of the harmonics (i.e. the quadratic sum of the harmonics) and the efficient value of the fundamental component, according to formula (1) hereafter:

$$HDR = 100 * \sqrt{(\Sigma_{(k=1->\infty)} H_k^2)} / H_0, \quad \text{Formula (1):}$$

where $H_0$ represents the value of the quadratic average, or the efficient value, of the fundamental component of the considered signal, and $H_K$ represents the value of the quadratic average of the K-rank harmonic. Formula (1) constitutes a harmonic distortion rate calculation formula, adapted to a frequency approach of the signal to be processed.

The HDR thus provides a frequency contents' quantitative evaluation of a signal to be measured, by indicating the energetic importance of the harmonics, in relation to the fundamental component of the signal.

Currently, the vast majority of measuring apparatus, capable of calculating the HDR of a signal, use an FFT algorithm (Fast Fourier Transform), based on the Fourier serial decomposition of the signal to be measured. Such algorithm provides amplitude and the phase of each frequency pace. Using such data, a second calculation, corresponding to Formula (1), enables to determine the HDR. By definition, such calculations are adapted to stationary signals. For evident practical reasons, a number of pre-defined points are thus initiated, very often equal to the power of two in order to optimise calculation times.

2. Brief Description of Related Developments

Apparatus currently available in the shops are adapted to measure HDRs on signals whose frequency is stationary and pre-defined. Typically, such frequencies are either 50 Hz (Hertz) on the European electric network, or 60 Hz on the American electric network, or even 400 Hz, for example, on certain networks found in aeronautics. Such apparatus are unable to operate for taking measurements on a signal whose frequency is variable and whose value may not be pre-defined.

Furthermore, the aforementioned FFT algorithms calculate the HDR over a considerable number of the signal's periods. Using such principle, it is not possible to distinguish a rapid variation of the HDR on a signal whose duration is slight in relation to the duration of the calculation window; in fact, such a rapid variation would be averaged out by the remainder of the measured signal.

Finally, calculation of the FFTs is applied, by principle, to a considerable number of the signal's periods; indeed, up until now, the signals analysed were stationary and it was not necessary to focus calculations on a short duration; hence, existing FFT calculations are not adapted to analyses on excessively short time intervals.

Having said that, there now exists some industrial sectors where the use of variable frequency electric networks are developing. This is notably the case in aeronautics. For example, the A380 long-haul aeroplane by Airbus implements an electric network of the sort. Indeed, the alternative electric network employed in the A380 is a triple-phase network, whose generation is produced by four variable frequency generators, having the abbreviation of VFG, directly coupled on the high pressure level of each reactor. Excitation of the alternator is controlled in such a manner as to obtain an efficient regulated 115 Volts to 200 Volts output voltage, the network frequency being comprised between approximately 360 Hz and 800 Hz. Each reactor drives a VFG which supplies its own alternative main bus bar.

As a general rule, the growing use of electricity in this field of application is notably motivated by a reduction in mass of the considered apparatus, by enabling a simplification of the heavy and restrictive hydraulic networks in terms of maintenance.

SUMMARY

A general problem that the aspects of the disclosed embodiments aim to resolve is thus to compensate for the lack of real-time calculation means for an instantaneous value of HDR, while being adapted to an electric network producing a variable frequency signal.

The purpose of the disclosed embodiments is to propose a solution to the problems and inconveniences that have just been described. In general terms, the invention proposes a method for instantaneously determining rates of distortion on variable frequency signals, and an associated device, wherein a harmonic distortion rate is calculated across the shortest possible temporal window, corresponding to the duration of a period of a considered signal's fundamental. Hence, the aim being to precisely determine the signal frequency value, whose HDR is to be calculated, an iteration of certain measurements, achieved at the time of a given calculation, is embodied in order to calculate the HDR on subsequent signals. Such a method may further be directly applied to fixed frequency alternating-current main supplies.

The aspects of the disclosed embodiments thus essentially concerns a method for instantaneously determining a distortion rate on an alternating-current main supply, characterised in that it comprises various steps consisting of:
  receiving, from the electric network, an input signal (Sin);
  selecting, using a first processing means (1), a unique period for the input signal in order to obtain a sample signal (Sper);
  transmitting the sample signal to a second processing means (2);
  calculating the sample signal's harmonic distortion rate using the second processing means.

Besides the main specifications just mentioned in the preceding paragraph, the method according to the aspects of the disclosed embodiments may represent one or several additional specifications from among the following:
  the alternating-current main supply is a variable frequency alternating-current main supply, the input signal being a variable frequency signal;
  the selection step, using the first processing means, with a unique period for the input signal, comprises various operations consisting of:
    filtering the input signal by way of a filtering device that filters the frequency of the input signal's fundamental in order to obtain a filtered signal for processing;
    identifying the period of the filtered signal to be processed and the start and end alternation instants of the filtered signal to be processed by detecting, using a third processing means, when the fundamental, present inside the filtered signal to be processed, passes through zero;
    selecting, using a means of selection, the sample signal by reporting onto the input signal the identified start and end alternation instants of the processed signal.
  the identification step of the period of the filtered signal to be processed, and of the start and end alternation instants of the filtered signal to be processed, comprise the additional initial process consisting of transmitting, from the selection means towards the third processing means, data relating to the end alternation instant of a filtered signal portion directly preceding the sample signal.
  the filtering device comprises a first filter showing a first cut-out frequency and a second filter showing a second cut-out frequency, the input signal being transmitted to the first filter and to the second filter, respectively producing a first filtered signal and a second filtered signal, transmitted respectively to a first zero-passing detection means and to a second zero-passing detection means using the third processing means, producing data relating to the passage through zero and transmitting individually the said zero-passing data to a unique logical comparator, such logical comparator interpreting the said data obtained for the purpose of determining the frequency of the fundamental to be considered during the identification process of the start and end alternation instants.
  the first cut-out frequency is equal to the maximal observable frequency on the variable frequency network, and the second cut-out frequency is lower than or equal to double the value of the minimal observable frequency on the variable frequency network.
  the first cut-out frequency is equal to 800 Hz and the second cut-out frequency is equal to 600 Hz.
  the selection step, using the first processing means, of a unique input signal alternating current comprises various operations consisting of:
    embodying, using a fourth processing means and on a truncated signal corresponding to the input signal on a pre-determined time interval, a frequency analysis of the truncated signal, in order to identify a frequency contents and the frequency of the input signal's fundamental;
    identifying, using a fifth processing means, a start date and an end date of the fundamental's cycle;
    selecting, using a means of selection, a temporal interval corresponding to a period of the input signal by reporting the start and end dates of the identified fundamental's cycle onto the truncated signal.
  the method comprises the initial step consisting of transmitting, from the selection means towards the fourth processing means, data relating to the end alternation instant of a signal portion directly preceding the sample signal.
  the calculation step, using the second processing means, of the sample signal's harmonic distortion rate comprises operations consisting of:
    embodying a complete frequency analysis of the sample signal in order to determine the amplitude of each one of the sample signal's harmonics;
    applying a harmonic distortion rate calculation formula, adapted to a frequency approach of the signal to be processed, to the determined amplitudes.
  the calculation step, using the second processing means, of the sample signal's harmonic distortion rate comprises operations consisting of:
    calculating the efficient values of the complete signal and of the fundamental;
    applying to the calculated efficient values a harmonic distortion rate calculation formula, adapted to a temporal approach of the signal to be processed.
  the input signal is a digital signal.
  the input signal is an analogical signal.

The aspects of the disclosed embodiments also refer to an instantaneous determination device for a distortion rate on alternating-current main supply signals, capable of implementing at least one implementation mode of the method according to the invention, the said device receiving an input signal at input, characterised in that the device notably comprises:
  a first processing means for selecting a unique period of the input signal in order to obtain a sample signal;
  a second processing means, receiving the sample signal at input, for calculating the harmonic distortion rate of the sample signal received.

Besides the main specifications just mentioned in the preceding paragraph, the method according to the aspects of the disclosed embodiments may represent one or several additional specifications from among the following:
  the alternating-current main supply is a variable frequency network
  the first processing means comprises:

a filtering device that filters the frequency of the input signal's fundamental in order to obtain a filtered signal for processing;

a third processing means identifying the period of the filtered signal to be processed, and the start and end alternation instants of the filtered signal to be processed, by detecting when the fundamental, present inside the filtered signal to be treated, passes through zero;

a means of selection determining the sample signal by reporting onto the input signal the identified start and end alternation instants of the processed signal.

the filtering device comprises a first filter showing a first cut-out frequency and a second filter showing a second cut-out frequency, the first filter and the second filter receiving the input signal and producing respectively a first filtered signal and a second filtered signal, and the third processing means comprises: —a first zero-passing detection means and a second zero-passing detection means, respectively receiving the first filtered signal and the second filtered signal, and producing data relating to the passage through zero, respectively by the first filtered signal and by the second filtered signal; —a unique logical comparator receiving the data relating to the passage through zero and interpreting the said data obtained in order to determine the frequency of the fundamental to be considered.

BRIEF DESCRIPTION OF THE DRAWINGS

These are only shown as examples and should not be considered as complete with regard to the aspects of the disclosed embodiments. The figures show.

DETAILED DESCRIPTION OF THE DISCLOSED EMBODIMENTS

The various elements illustrated in several figures will, unless otherwise stated, retain the same reference.

Figure 1:
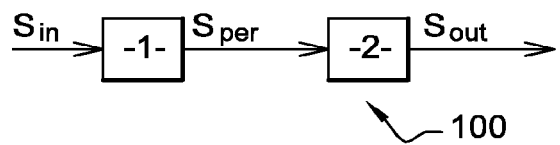
in FIG. 1, a schematic and general illustration of the device.

FIG. 1 illustrates, quite schematically, an example 100 of the device according to the invention. An input signal Sin is supplied by the variable frequency electric network. The input signal Sin is received by a first processing means 1, which selects, according to a first step of the method according to the invention, a unique period for the input signal Sin. Although the considered electric network supplies a variable frequency alternating current, here the input signal period designates the input signal period characterising the said input signal during a given temporal window, such input signal being indeed periodic across the considered temporal window.

The unique period selected using the first processing means 1 is thus transmitted, through the intermediary of a sample signal Sper, to a second processing means 2 of the device according to the invention. The second processing means 2 embodies, according to a second step of the method according to the invention, a HDR calculation for each signal period transmitted to it through the intermediary of the sample signal Sper. Hence, for each input signal period Sin, transmitted to the second processing means through the intermediary of the sample signal Sper, the device according to the invention is able to embody a HDR calculation and to supply, in the form of an output signal Sout, a digital value or, in the case of an entirely analogical process, an analogical form of the calculation result.

As a general rule, the signals' processing just described is implemented either directly on the analogical signals or on the digital samples, obtained traditionally by passing an analogical signal through an analogical/digital converter.

Figure 2:
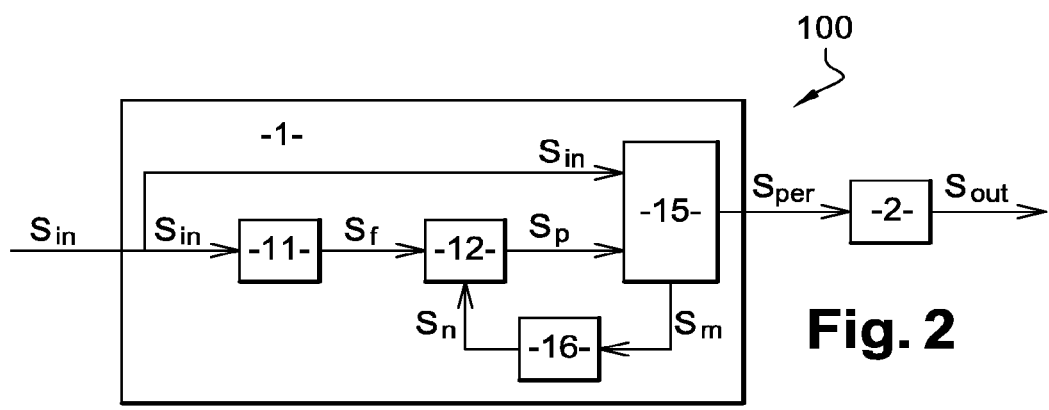
in FIG. 2, a first example of schematic embodiment of a first processing means intervening inside the device.

FIG. 2 illustrates an embodiment example of the first processing means 1. In this example, the first processing means 1 is constituted of a filtering device 11, of a third processing means 12, of a means for selection 15 and of an iteration circuit 16.

The filtering device 11 receives the input signal Sin at entry; its role is to filter the input signal Sin in order to only retain the frequencies near to the frequency of the fundamental component, also often called "fundamental", of the input signal Sin and thus to supply a filtered signal for processing Sf. The filtered signal to be processed Sf is then transmitted to the third processing means 12, the role of which being to embody the fundamental's zero-passing detection process in order to identify the period of the filtered signal Sf and the start alternation and end alternation instants of the filtered signal Sf.

As a general rule, the term "alternation" refers to the signal portion comprised between a first instant, called "start alternation", and a second instant, called "end alternation", the signal amplitudes at the start alternation and end alternation instants being equal, though not necessarily at zero, the considered signal having evolved across a complete unique period between the start alternation and end alternation instants. The term "cycle" refers to a particular alternation, for which the amplitudes observed at the start and end alternation instants—or dates—are at zero.

Data relating to the start and end alternation instants are transmitted in the form of a signal Sp to a first input of a selection device, which further receives, at a second input, the input signal Sin. The role of the selection device 15 is thus to only select, by reporting the start alternation and end alternation instants on the input signal Sin, a unique period of the input signal Sin, the period thus selected corresponding to the sample signal Sper, which is then transmitted to the second processing means 2.

Simultaneously to the transmission of the sample signal Sper with the second processing means 2, a first data signal Sm, corresponding to processing end data and notably comprising the end alternation instant of the signal's period Sin having just been processed, is transmitted from the selection means 15 towards an iteration circuit 16. The latter uses such data to transmit, through the intermediary of a second data signal Sn, input data to the third processing means 12, the latter being capable of extracting from the second data signal start alternation data for the next signal period Sin to be processed. Hence, the latter shall be the period directly following the signal Sin, the whole signal Sin thus being able to be processed.

Figure 3:
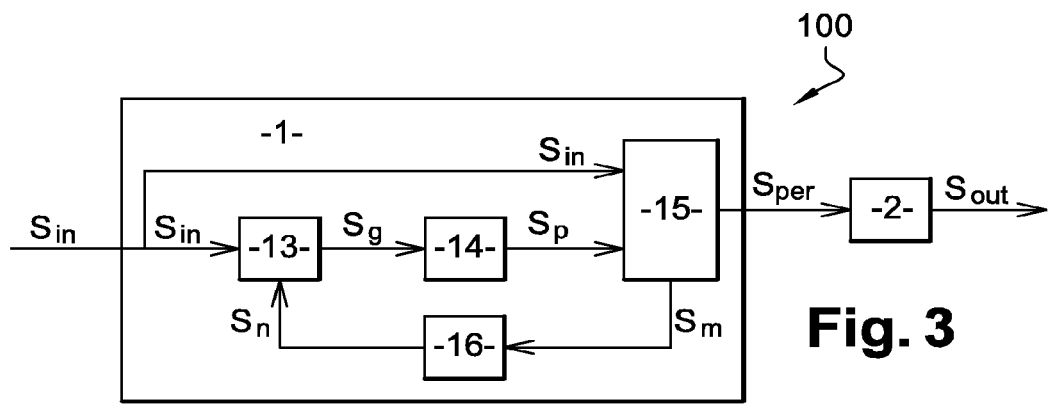
in FIG. 3, a second example of schematic embodiment of the first processing means intervening inside the device.

FIG. 3 illustrates a second embodiment example of the first processing means 1. In this example, the first processing means 1 is constituted of a fourth processing means 13, of a fifth processing means 14, of a means for selection 15 and of an iteration circuit 16.

The fourth processing means 13 receives the input signal Sin at input, from which it extracts a portion corresponding to a pre-defined temporal window of the signal Sin and forming a truncated signal; the role of the fourth processing means 13 is to embody a frequency analysis of the truncated signal in order to extract the frequency contents therefrom and to identify the frequency of the truncated signal's fundamental. The data elaborated by the fourth processing means 13 are transmitted, in the form of a third data signal Sg, to the fifth processing means 14, the role of which being to determine, using the frequency data transmitted, the start and end alternation instants of the input signal Sin, corresponding to the dates of cycle start and cycle finish of the truncated signal's fundamental.

Like in the first example, the data relating to the start and end alternation instants are transmitted in the form of the data signal Sp to the first input of a selection device 15, whose role is the same as that described in the first example.

The signals supplied and received by the iteration circuit 16 are identical to those of the first example described. Nevertheless, in the second example, the second data signal Sn is transmitted to the fourth processing means 13, which thus has knowledge of the new date as from when search for the input signal's fundamental needs to be sought after.

Figure 4:
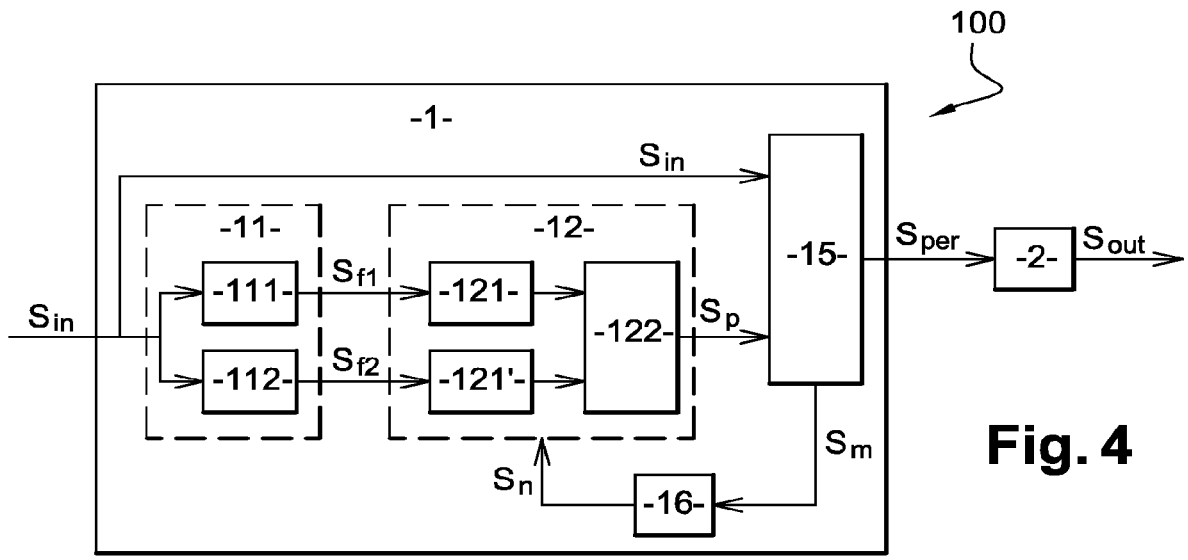
in FIG. 4, a detailed embodiment example of the embodiment example shown in FIG. 2.

FIG. 4 illustrates a detailed embodiment example corresponding to the most general device shown in FIG. 2. This detailed example is especially adapted to the case where the frequency of the fundamental of the input signal Sin is likely to vary across a range of frequencies comprised between a minimal frequency and a maximal frequency exceeding double the minimal frequency. This is the case, for example, for variable frequency electric networks whose frequency may vary across a range extending from 360 Hz to 800 Hz.

For such electric networks, it is delicate to propose filtering wherein the input signal's first harmonic is, in all cases, sure to be cut, even though filtering of the input signal's fundamental component is ensured (i.e. passage is allowed), again in all cases. Indeed, in the case where the fundamental component is comprised between 360 Hz and 400 Hz, the frequency of the first harmonic shall be comprised between 720 Hz and 800 Hz, i.e. still within the possible frequency range for an input signal's fundamental component of the network being considered. The third processing means 12 thus risks to identify the first harmonic as a fundamental component.

It is thus necessary, through a filtering device 11, to be able to cut a signal comprised between 720 Hz and 800 Hz when such signal corresponds to a first harmonic of the input signal Sin, and to filter such signal when it corresponds to a fundamental component of the input signal Sin; this having the aim to supply a filtered signal Sf that may be used during the third processing means 12.

In order to respond to such expectations, the embodiment of the filtering device 11 is proposed, in the example in FIG. 4, using a first filter 111 and a second filter 112, the first filter and the second filter being, for example, low-pass filters with different cut-out frequencies, respectively equal to 800 Hz and 600 Hz in the example being considered. In other embodiment examples, the cut-out frequencies chosen are different from those mentioned. Hence, a first cut-out frequency, comprised between 750 Hz and 850 Hz, and a second cut-out frequency, comprised between 550 Hz and 650 Hz, are chosen. The first filter 111 and the second filter 112 each receive at input the input signal Sin, which is pre-duplicated, and respectively produce a first filtered signal Sf1 and a second filtered signal Sf2. The first filtered signal Sf1 and the second filtered signal Sf2 are respectively transmitted to a first module 121 and to a second module 121' of the third processing means 12, the first module and the second module being zero-passing detection means, which are, in this example, identical. The zero-passing detection data elaborated by modules 121 and 121' are then transmitted to a logical comparator 122 of the third processing means 12, which, depending on the said zero-passing detection data, determines the frequency of the fundamental to be considered. This determination is embodied as follows:

when the real frequency of the fundamental is comprised between 360 Hz and 400 Hz, the frequency of the signals detected in the first filtered signal Sf1 will be comprised between 720 Hz and 800 Hz, corresponding to the first harmonic, and the frequency of the signals detected in the second filtered signal Sf2 will be comprised between 360 Hz and 400 Hz;

when the real frequency of the fundamental is comprised between 400 Hz and 600 Hz, the frequency of the signals detected in the first filtered signal Sf1 will be comprised between 400 Hz and 600 Hz, and the frequency of the signals detected in the second filtered signal Sf2 will also be comprised between 400 Hz and 800 Hz;

when the real frequency of the fundamental is comprised between 600 Hz and 800 Hz, the frequency of the signals detected in the first filtered signal Sf1 will be comprised between 600 Hz and 800 Hz, and no signal will be detected in the second filtered signal Sf2, the input signal here being completely cut out by the second filter 112.

Hence, when the logical comparator 122 detects the presence of different signals originating from the first filter 111 and from the second filter 112, it considers solely the second filtered signal Sf2 originating from the second filter 112 as containing the fundamental of the input signal; when the logical comparator 122 detects the presence of identical signals originating from the first filter 111 and from the second filter 112, it indifferently considers the first filtered signal Sf1 or the second filtered signal Sf2 as containing the fundamental of the input signal; when the logical comparator 122 detects the presence of a signal originating from the first filter 111 and a lack of signal originating from the second filter 112, it solely considers the first filtered signal Sf1 originating from the first filter 111 as containing the fundamental of the input signal.

The logical comparator 122 thus enables to transmit, after processing through modules 121 or 121', the right filtered signal, i.e. the one containing the fundamental of the input signal Sin, using selection means 15.

The HDR calculation, embodied through the second processing means 2, may then be carried out according to various methods. In the first method, traditional, the second processing means 2 initiates a full frequency analysis of the sample signal Sper that it receives, by establishing the frequency spectrum therefrom, i.e. by extracting amplitude values from it for each of the harmonics and of the fundamental of the signal being considered. Once these values have been determined, the aforementioned formula (1) is applied.

In a second method, a temporal approach of the signal to be processed is embodied. Such a method appears most efficient in terms of calculation time, thus being more adapted to real-time applications, and may be used indifferently on digital signals and on analogical signals. In such an approach, the efficient values of the various signals implicated need to be considered.

Figure 5:
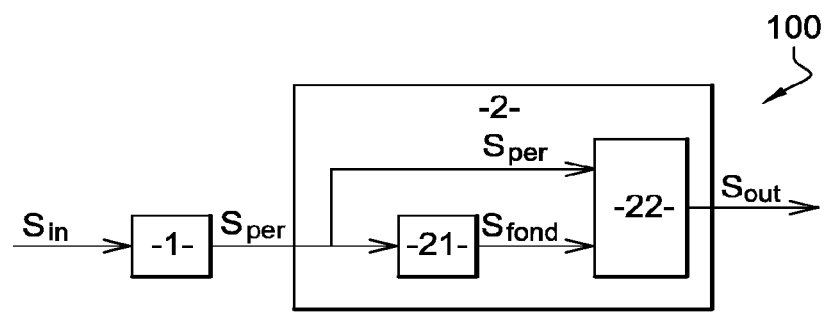
in FIG. 5, a first example of schematic embodiment of a second processing means intervening inside the device.

In a first embodiment example of such an approach, schematically illustrated in FIG. 5, the second processing means 2, which receives the sample signal Sper at input, comprises a first processing module 21, which, using the sample signal Sper, elaborates a signal Sfond, relating to the frequency of the fundamental, which only comprises the frequency contents relating to the frequency of the signal's fundamental. To this end, the first processing module instigates, for example, a filtering process, digital or analogical depending on the type of the signal Sper, notably with a band pass filter centred across the fundamental. A second processing module 22 of the second processing means 2 then uses the signal Sfond, as well as the sample signal Sper, to embody a HDR calculation according to the following formula (2):

$$HDR=100*+\sqrt{((V_{Sper}/V_{Sfond})^2-1)},\quad\text{Formula (2):}$$

where $V_{Sper}$ represents the efficient value of the sample signal Sper, and where $V_{Sfond}$ represents the efficient value of the signal Sfond.

Figure 6:
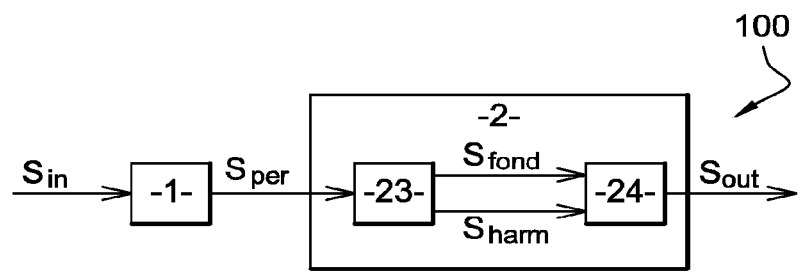
in FIG. 6, a second example of schematic embodiment of the second processing means intervening inside the device.

In a second embodiment example of such an approach, schematically illustrated in FIG. 6, the second processing means 2, which receives the sample signal Sper at input, comprises a third processing module 23, which, using the sample signal Sper, separates the signal Sfond relating to the frequency of the fundamental of a complementary signal Sharm, corresponding to the sample signal Sper from which the signal Sfond has been withdrawn. To this end, the first processing module instigates, for example, a filtering process, digital or analogical depending on the type of the signal Sper, notably with a band pass filter centred across the frequency of the fundamental. A fourth processing module 24 of the second processing means 2 then uses the signals Sfond and Sharm in order to embody a HDR calculation according to the formula (3) below:

$$HDR=100*(V_{Sharm}/V_{Sfond}),\quad\text{Formula (3):}$$

where $V_{Sharm}$ represents the efficient value of the signal Sharm, and where $V_{Sfond}$ represents the efficient value of the signal Sfond.

Formulae (2) and (3) constitute here harmonic distortion rate calculation formulae, adapted to a temporal approach of the signal to be processed.

What is claimed is:

1. A method for determining a distortion rate of an alternating-current main supply for an electric network comprising:
receiving, from the electric network, an input signal corresponding to the main supply, wherein a fundamental period of the main supply is unknown;
identifying the fundamental period of the main supply by analyzing the input signal, wherein the identification of the fundamental period includes filtering the input signal by removing certain frequencies from the input signal to obtain a filtered signal, wherein the filtering is performed using a first lowpass filter passing frequencies of the input signal below a first cut-out frequency and a second lowpass filter passing frequencies of the input signal below a second cut-out frequency, and the filtering of the input signal further comprises:
transmitting the input signal to the first filter and to the second filter,
respectively producing a first filtered signal as an output of the first filter and a second filtered signal as an output of the second filter,
producing data indicating when the first filtered signal reaches the certain value and when the second filtered signal reaches the certain value;
transmitting the data to a logical comparator, and
interpreting said data with the logical comparator to determine a frequency of the fundamental period;
identifying start and end alternation instants of the filtered signal by detecting when the amplitude of the filtered signal reaches a certain value,
generating a sample signal from the input signal, wherein a period of the sample signal corresponds to the fundamental period and the duration of the sample signal is the period, wherein the generation of the sample signal includes applying the identified start and end alternation instants of the filtered signal to determine a start and an end of the sample signal, and
calculating a harmonic distortion rate for the main supply using the fundamental period and the sample signal.

2. The method according to claim 1, wherein the alternating-current main supply has a variable frequency.

3. The method according to claim 1, wherein the identification of the fundamental period and identification of the start and end alternation instants of the filtered signal comprises analyzing a portion of the filtered signal preceding the sample signal.

4. The method according to claim 1, wherein the first cut-out frequency is equal to a maximal observable frequency on the network, and the second cut-out frequency is lower than or equal to double a value of a minimal observable frequency on the electrical network.

5. The method according to claim 1, wherein said first cut-out frequency is equal to 800 Hz and in that the second cut-out frequency is equal to 600 Hz.

6. The method according to claim 1, wherein the identification of the fundamental period further comprises:
extracting a truncated signal corresponding to a portion of the input signal having a pre-determined time interval,
performing a frequency analysis of the truncated signal to identify a frequency of the fundamental period of the input signal; and
identifying a start and an end in the truncated signal of a cycle of the truncated signal to define a sample period having a during corresponding to the fundamental period.

7. A method according to claim 6, wherein a portion of the truncated signal directly precedes the sample signal.

8. A method according to claim 1, wherein the calculation of the harmonic distortion rate comprises:
identifying harmonics of the fundamental frequency in the input signal;
performing a frequency analysis of the sample signal to determine an amplitude of each of the harmonics in the sample signal;
applying a harmonic distortion rate calculation formula, adapted to a frequency approach, using the sample signal and using the determined amplitudes of the harmonics.

9. A device for instantaneously determining a distortion rate of an alternating-current main supply, comprising:
a first processing means for identifying a fundamental period of an input signal corresponding to the main supply and, from the input signal, obtaining a sample signal having a period commensurate with the fundamental period, wherein the first processing means comprises a filtering device that filters a frequency corresponding to the fundamental period to obtain a filtered signal for processing, wherein the filtering device comprises a first lowpass filter passing frequencies of the input signal below a first cut-out frequency and a second lowpass filter passing frequencies of the input signal below a second cut-out frequency, wherein the first lowpass filter and the second lowpass filter receive the input signal and produce respectively a first filtered signal and a second filtered signal;

a second processing means for calculating a harmonic distortion rate of the input signal;

a third processing means for identifying the fundamental period of the filtered signal and identifying start and end instants of the filtered signal by detecting when the filtered signal reaches a certain value of the filtered signal, wherein the third processing means comprises an amplitude value detection means detecting when the first filtered signal reaches a certain amplitude value and detecting when the second filtered signal reaches the certain value, and producing data relating to the certain amplitude value occurrences in the first filtered signal and the second filtered signal, and a logical comparator receiving the data relating to the certain amplitude value occurrences and interpreting the data to determine a frequency of the fundamental period; and a means of selection for determining the sample signal by applying the identified start and end alternation instants to the input signal.

10. A device according to claim 9, wherein the alternating-current main supply is produced by a variable frequency network.

11. A method for determining a distortion rate of an alternating-current (AC) signal powering an electric network, the method comprising:

identifying a fundamental frequency of the AC signal by analyzing the AC signal, wherein the AC signal has a unknown frequency, wherein identifying the fundamental frequency further comprises:

filtering frequencies out of the AC signal above a first frequency to generate a first filtered signal and above a second frequency to generate a second filtered signal;

generating first data indicating occurrences of a first amplitude value of the first filtered signal, wherein the first amplitude value is an amplitude value of the first filtered signal;

generating second data indicating occurrences of a second amplitude value of the second filtered signal wherein the second amplitude value is an amplitude value of the second filtered signal, and comparing the first data and the second data to identify the fundamental frequency;

capturing a sample of the AC signal having a duration corresponding to a single cycle of the fundamental frequency of the AC signal, and calculating a harmonic distortion rate of the AC signal using the sample.

12. The method of claim 11 wherein the fundamental frequency varies within a certain frequency range.

13. The method of claim 11 wherein the capturing of the sample includes identifying instances when the signal reaches a predetermined amplitude value.

14. A method for determining a distortion rate of an alternating-current (AC) signal powering an electric network, the method comprising:

receiving a portion of the AC signal from the electrical network, wherein a fundamental frequency of the AC signal is unknown;

identifying the fundamental frequency of the AC signal by:

filtering frequencies from the AC signal above a first frequency to generate a first filtered signal and above a second frequency to generate a second filtered signal;

generating first data indicating occurrences of a first amplitude value of the first filtered signal, wherein the first amplitude value is an amplitude value of the first filtered signal;

generating second data indicating occurrences of a second amplitude value of the second filtered signal wherein the second amplitude value is an amplitude value of the second filtered signal, and comparing the first data and the second data to identify the fundamental frequency;

selecting a signal sample of the AC signal, wherein the sample has a duration corresponding to a cycle of the fundamental frequency of the AC signal, and determining a harmonic distortion rate of the AC signal based on a calculation using an efficient value of the signal sample and an efficient value of fundamental frequency.

15. The method according to claim 14, wherein the AC signal has a variable frequency.

16. The method according to claim 14, wherein the identification of the fundamental frequency includes:

identifying as a start and an end to the signal sample two of the occurrences when the AC signal has the certain amplitude.

* * * * *